United States Patent
Krehbiel et al.

(10) Patent No.: US 6,206,728 B1
(45) Date of Patent: Mar. 27, 2001

(54) SHIELDED ELECTRICAL CONNECTOR SYSTEM

(75) Inventors: Fred Love Krehbiel, Chicago; Julie Beyers Rutter, Downers Grove; Bruce F. Smith, Plainfield, all of IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/255,218

(22) Filed: Feb. 22, 1999

(51) Int. Cl.[7] ................................................. H01R 13/648
(52) U.S. Cl. ............................................ 439/607; 439/939
(58) Field of Search .................................... 439/607, 609, 439/92, 95, 96, 108, 79, 939

(56) References Cited

U.S. PATENT DOCUMENTS

| | | | |
|---|---|---|---|
| 5,112,251 | * 5/1992 | Cesar | 439/607 |
| 5,378,172 | 1/1995 | Roberts | 439/607 |
| 5,622,523 | * 4/1997 | Kan et al. | 439/607 |
| 5,637,015 | 6/1997 | Tan et al. | 439/607 |
| 5,702,271 | 12/1997 | Steinman | 439/676 |
| 5,967,806 | * 10/1999 | Patterson | 439/108 |

FOREIGN PATENT DOCUMENTS

| | | | |
|---|---|---|---|
| 5-152031 | 6/1993 | (JP) | H01R/13/658 |
| 8-106961 | 4/1996 | (JP) | H01R/17/04 |
| 8-222324 | 8/1996 | (JP) | H01R/13/648 |
| WO 97/10628 | 3/1997 | (WO) | H01R/23/68 |

* cited by examiner

Primary Examiner—Brian Sircus
Assistant Examiner—Thanh-Tam Le
(74) Attorney, Agent, or Firm—Stacey E. Caldwell

(57) ABSTRACT

A shielded electrical connector system includes a conductive chassis having an opening. An electrical connector is insertable into the opening in an insertion direction. The connector includes a dielectric housing mounting a plurality of terminals. A conductive shield is mounted about at least a portion of the housing and includes at least one side wall having a contact beam projecting outwardly therefrom. The contact beam extends back over the side wall to apply a normal force to the chassis adjacent the opening in a direction generally perpendicular to the insertion direction of the connector. In an alternative embodiment, the contact beam is formed to apply a normal force to a surface of the chassis adjacent the opening in a direction generally parallel to the insertion direction of the connector.

17 Claims, 6 Drawing Sheets

SHIELDED ELECTRICAL CONNECTOR SYSTEM

FIELD OF THE INVENTION

This invention generally relates to the art of electrical connectors and, particularly, to a shielded electrical connector system wherein an electrical connector is mounted in an opening in a conductive chassis.

BACKGROUND OF THE INVENTION

Generally, an electrical connector typically includes some form of dielectric housing designed in a predetermined configuration for mating with a complementary mating connector or other connecting device such as a printed circuit board or the like. The housing mounts a plurality of conductive terminals which have contacting and/or terminating portions for engaging the terminals or circuits of the complementary mating connector or other connecting device. Some connectors are provided with conductive shields, such as stamped and formed sheet metal shrouds, which cover or surround at least portions of the housing. The shields provide protection against the ingress and/or egress of electromagnetic interference (EMI) . The connector shield typically is grounded to a shield of the complementary mating connector shield enclosure or to ground traces on a printed circuit board.

In some applications, shielded electrical connectors are designed for mounting within apertures in a conductive chassis, panel or backplane. The shield of the connector typically is grounded to the chassis in areas about the aperture at which the connector is mounted. It is highly desirable to provide a good or strong engagement between the shield and the chassis to provide an adequate ground path therebetween. On the other hand, the strong interengagement between the shield and the chassis causes problems in creating undesirable forces in oblique directions not appropriate for given applications. The present invention is directed to solving these problems by providing a shielded electrical connector system wherein an electrical connector is mounted in an opening in a conductive channel and the shield of the connector engages the channel in precise directions.

SUMMARY OF THE INVENTION

An object, therefore, of the invention is to provide a new and improved electrical connector system of the character described.

In the exemplary embodiment of the invention, the system includes a conductive chassis having an opening, with an electrical connector insertable into the opening in an insertion direction. The connector includes a dielectric housing mounting a plurality of terminals. A conductive shield is mounted about at least a portion of the housing and includes at least one side wall having a contact beam projecting outwardly thereof and extending back over the side wall to apply a normal force to the chassis adjacent the opening in a direction generally perpendicular to the insertion direction.

As disclosed herein, the conductive chassis is fabricated of die-cast metal material, and the conductive shield is stamped and formed of sheet metal material. The contact beam of the shield is bent outwardly of and folded back over the side wall of the shield. The contact beam terminates in a rounded distal end for engaging the chassis adjacent the opening therein. Preferably, the conductive shield substantially surrounds the dielectric housing, and a plurality of the contact beams are spaced along at least two opposite sides of the connector.

In an alternative embodiment, the contact beam(s) are formed to apply a normal force to a surface of the chassis adjacent the opening therein, in a direction generally parallel to the insertion direction of the connector.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 1:
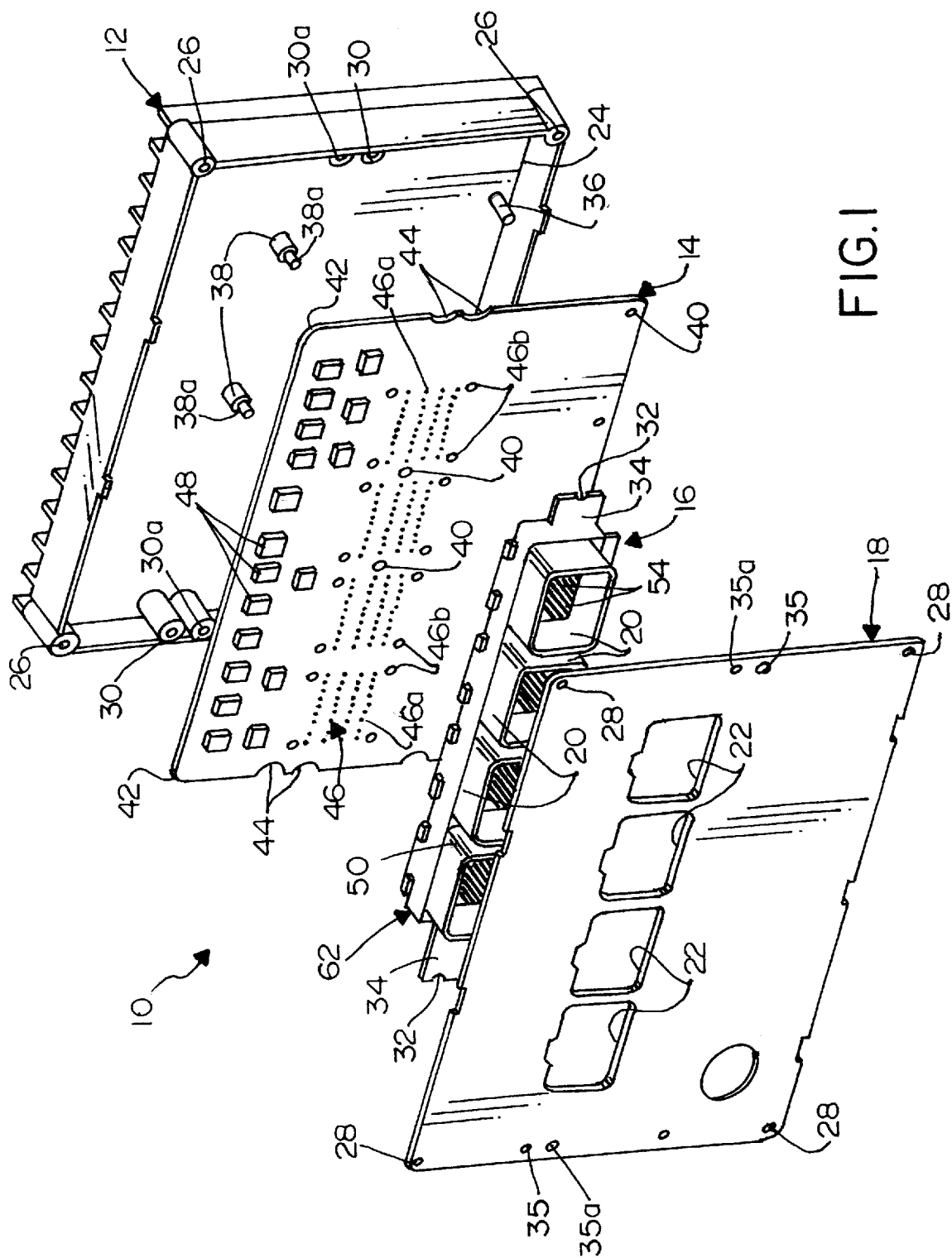
FIG. 1 is an exploded perspective view of an electrical connector system in which the invention is applicable.

Referring to the drawings in greater detail, and first to FIG. 1, the invention is embodied in an electrical connector system, generally designated 10, which includes a die-cast metal housing, generally designated 12, which receives a printed circuit board, generally designated 14, on which an electrical connector assembly, generally designated 16, is mounted. A metal chassis or cover, generally designated 18, substantially closes the assembly onto the housing, with receptacles 20 of the connector assembly projecting through openings or apertures 22 in the cover.

More particularly, housing 12 is recessed, as at 24, for receiving printed circuit board 14 to which connector assembly 16 has been mounted. The housing has four internally threaded corner bosses 26 for receiving appropriate fasteners (such as screws, not shown) inserted through four mounting holes 28 at the corners of cover 18. The housing has additionally internally threaded mounting bosses 30 for receiving appropriate fasteners extending through notches 32 in a pair of end wings 34 of connector assembly 16. The fasteners are inserted through holes 35 in cover 18. Additional fasteners are inserted through holes 35a in the cover and into the mounting bosses 30a on the housing. Printed circuit board 14 seats onto a plurality of edge platform bosses 36 within recess 24 of housing 12 and onto a plurality of central platform bosses 38 having projecting pin portions 38a for insertion into appropriate mounting holes 40 in the printed circuit board.

Printed circuit board 14 of connector system 10 has corner holes 40 and corner notches 42 aligned with corner bosses 26 of housing 12 for passing therethrough of the appropriate fasteners. The printed circuit board also has side notches 44 aligned with mounting bosses 30 and 30a. A plurality of holes are formed in the printed circuit board for receiving the terminal pins from connector assembly 16. Suffice it say, the holes are arranged in a predetermined pattern or array, generally designated 46, having holes 46a corresponding to the signal terminal pins of the connector assembly and holes 46b corresponding to the ground pins of the assembly. Of course, appropriate signal and ground circuit traces are provided on the printed circuit board, as is known in the art, and which may lead to a plurality of circuit components 48 mounted on the board.

Figure 2:
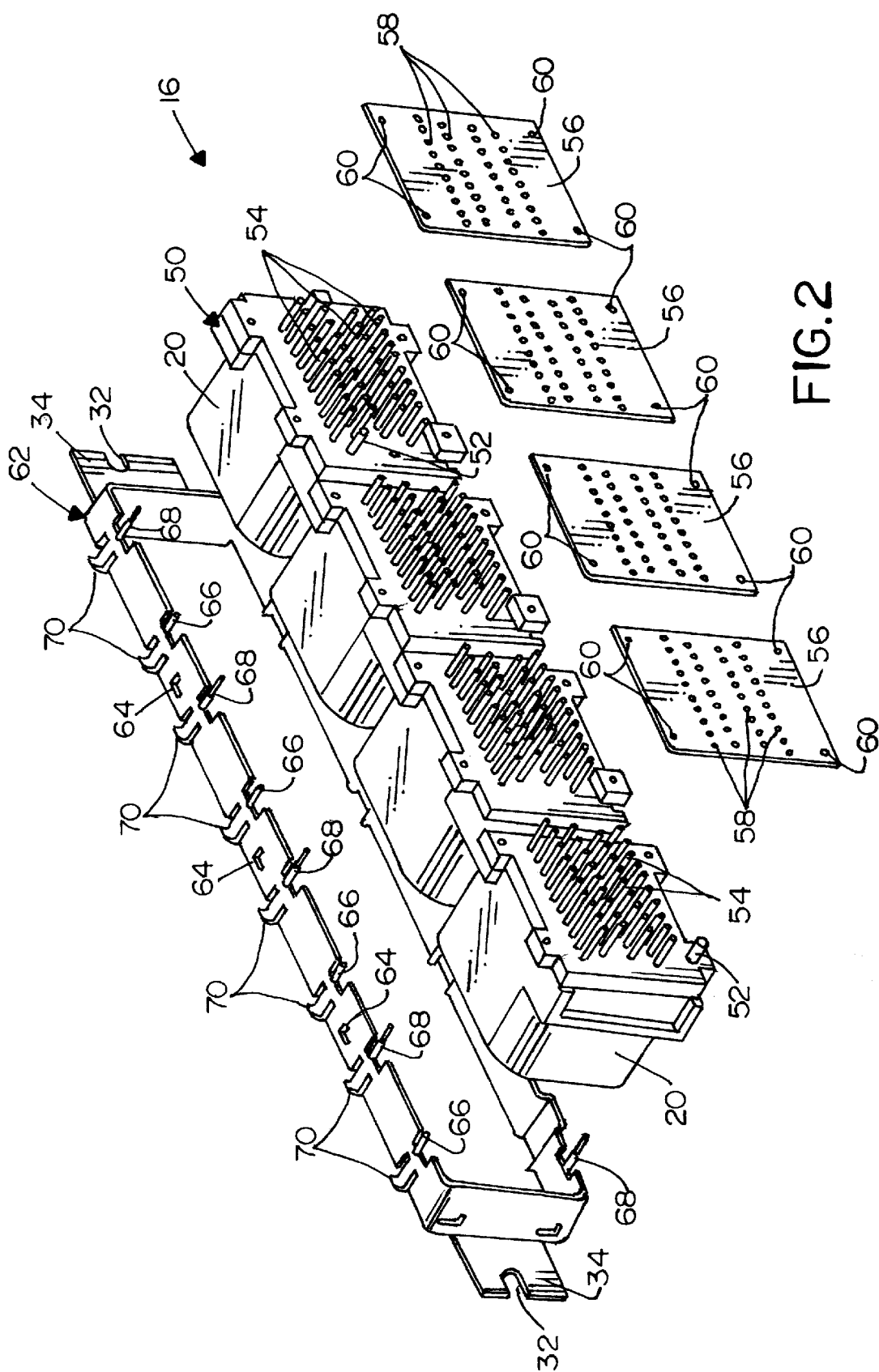
FIG. 2 is an exploded perspective view of the electrical connector assembly in the system of FIG. 1 and which incorporates one embodiment of the shield of the invention.

Referring to FIG. 2 in conjunction with FIG. 1, connector assembly 16 generally is in the form of a header connector including a dielectric housing, generally designated 50, unitarily molded of plastic material or the like. The housing forms receptacles 20 described above for insertion through apertures 22 in cover 18 of connector system 10. In essence, connector assembly 16 comprises a plurality (four) of separate connectors defined by receptacles 20 within the single unitarily molded dielectric housing. Each receptacle can receive a separate complementary mating connector. Dielectric housing 50 includes a plurality of unitarily molded mounting posts 52 for insertion into appropriate mounting holes in printed circuit board 14 for mounting the connector assembly onto the board, as will be seen hereinafter. A plurality of signal terminal pins 54 are mounted in housing 50 for each receptacle/connector 20.

Still referring to FIG. 2, connector assembly 16 includes a plurality (four) of flat flexible circuits 56, one flat flexible circuit for each receptacle/connector of the assembly. Each flat flexible circuit has an array of pin-Patent receiving holes 58 for receiving signal terminal pins 54. In comparing FIG. 2 with FIG. 1, it can be seen that external ends of signal terminal pins 54 can extend through holes 58 in flat flexible circuit 56, while internal ends of the signal terminal pins are exposed within receptacles 20 for engaging female terminals of the complementary mating connectors. Finally, each flat flexible circuit 56 has a hole at each corner thereof for receiving ground terminal pins from a shield of the connector assembly, as described below.

In particular, an elongated, generally rectangular shield, generally designated 62, substantially surrounds dielectric housing 50 and will be sandwiched between printed circuit board 14 and cover 18 (FIG. 1). The shield is stamped and formed of conductive sheet metal material, such as brass or the like, which includes end wings 34 and notches 32 described above. The shield has inwardly directed latch tabs 64 for latchingly engaging dielectric housing 50. The shield is integrally formed with a plurality of short ground pins 66 and long ground pins 68 spaced along the opposite longitudinal sides of the elongated rectangular shield for insertion into holes 60 in flat flexible circuits 56. At least the distal ends of the long ground pins 68 are plated with a highly conductive material such as tin or the like.

Figure 3:
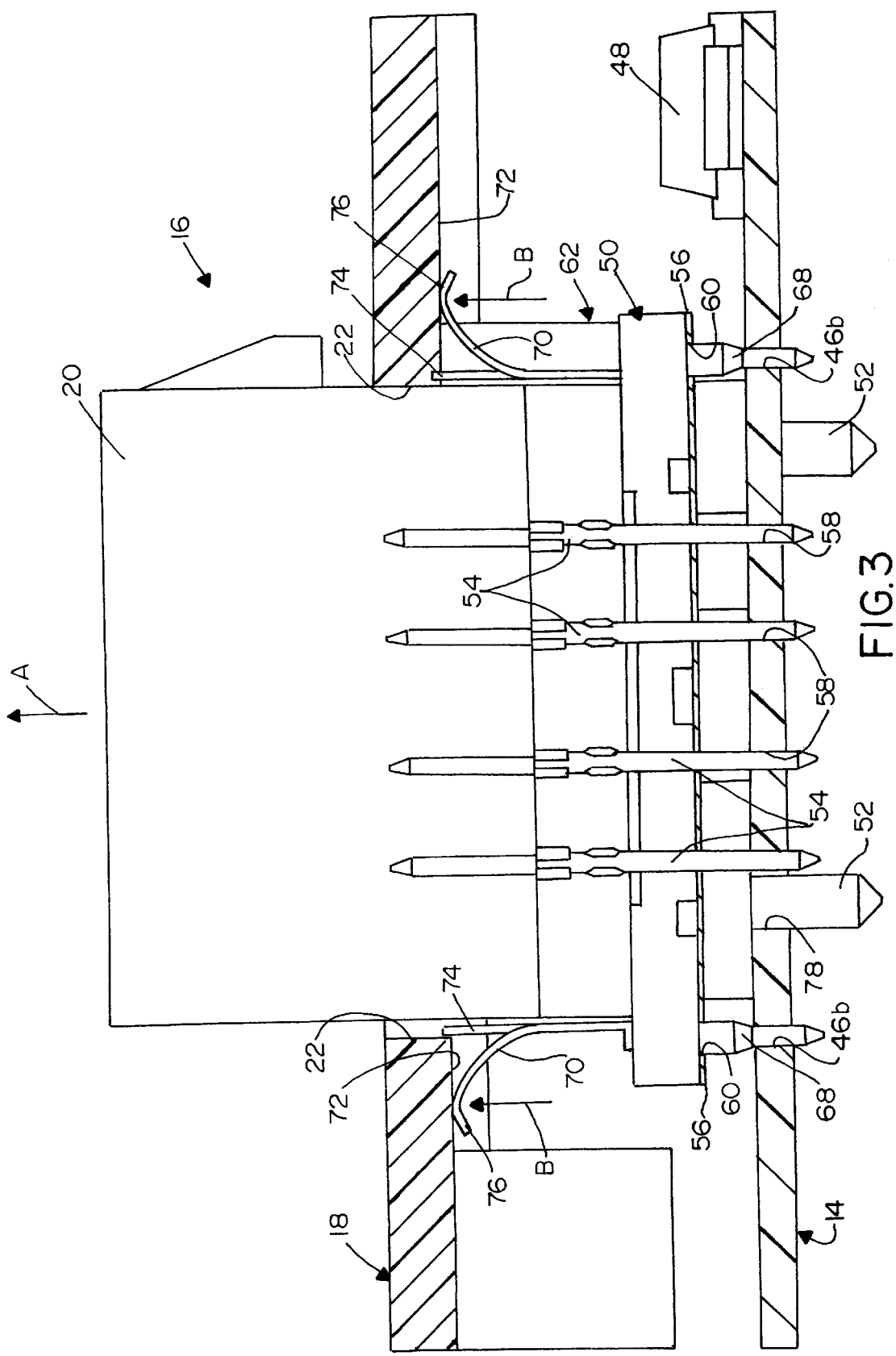
FIG. 3 is a section through the connector assembly mounted in the system of FIG. 1, with the die-cast housing not shown.
Figure 4:
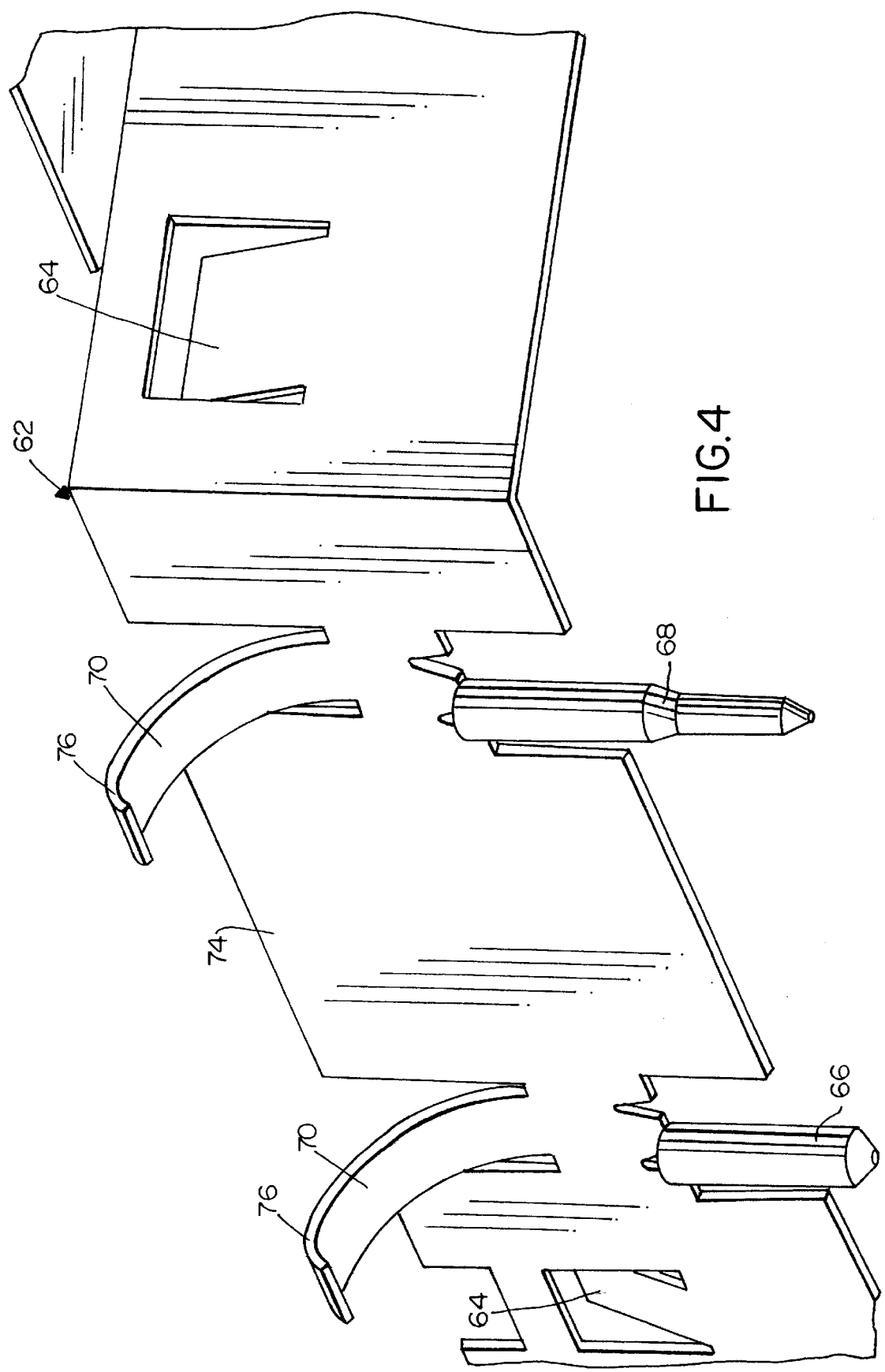
FIG. 4 is a fragmented perspective view of the shield in the embodiment of FIGS. 1–3 to better show the configuration of the contact beams thereof.

Referring to FIGS. 3 and 4 in conjunction with FIGS. 1 and 2, connector assembly 16 is inserted through apertures 22 in chassis 18 in the direction of arrow "A" (FIG. 3). Actually, the connector assembly would already be mounted on printed circuit board 14 which, in turn, would be mounted in housing 12, and then chassis or cover 18 will be mounted over the connector assembly to enclose the entire connector system 10 (FIG. 1). In any event, arrow "A" represents the relative insertion direction of receptacles 20 of connector assembly 16 through apertures 22 in chassis 18.

A plurality of contact beams 70 are stamped and formed out of shield 62 for engaging an inside surface 72 of chassis 18 as best seen in FIG. 3. The contact beams are bent outwardly from side walls 74 of the shield and terminate in rounded distal ends 76 which engage inside surface 72 of the chassis. Contact beams 70 are configured to apply substantially only a normal force to the inside surface of the chassis in the direction of arrows "B" when receptacles 20 of the connector are inserted through apertures 22 in the chassis in the direction of arrow "A". Therefore, there are substantially no side forces or loads on the connector assembly when the chassis or cover is installed onto housing 12 (FIG. 1). This arrangement accomodates X-Y axis dimensional variances. Yet, contact beams 70 provide strong positive grounding engagement between conductive shield 62 and chassis 18.

FIG. 3 also shows how signal terminal pins 54 extend through holes 58 in printed circuit board 14 and how mounting posts 52 of the connector housing extend through appropriate mounting holes 78 in the printed circuit board. Ground pins 68 of shield 62 also are shown projecting sequentially through holes 60 in flat flexible circuits 56 and then into holes 46b in the printed circuit board.

Figure 5:
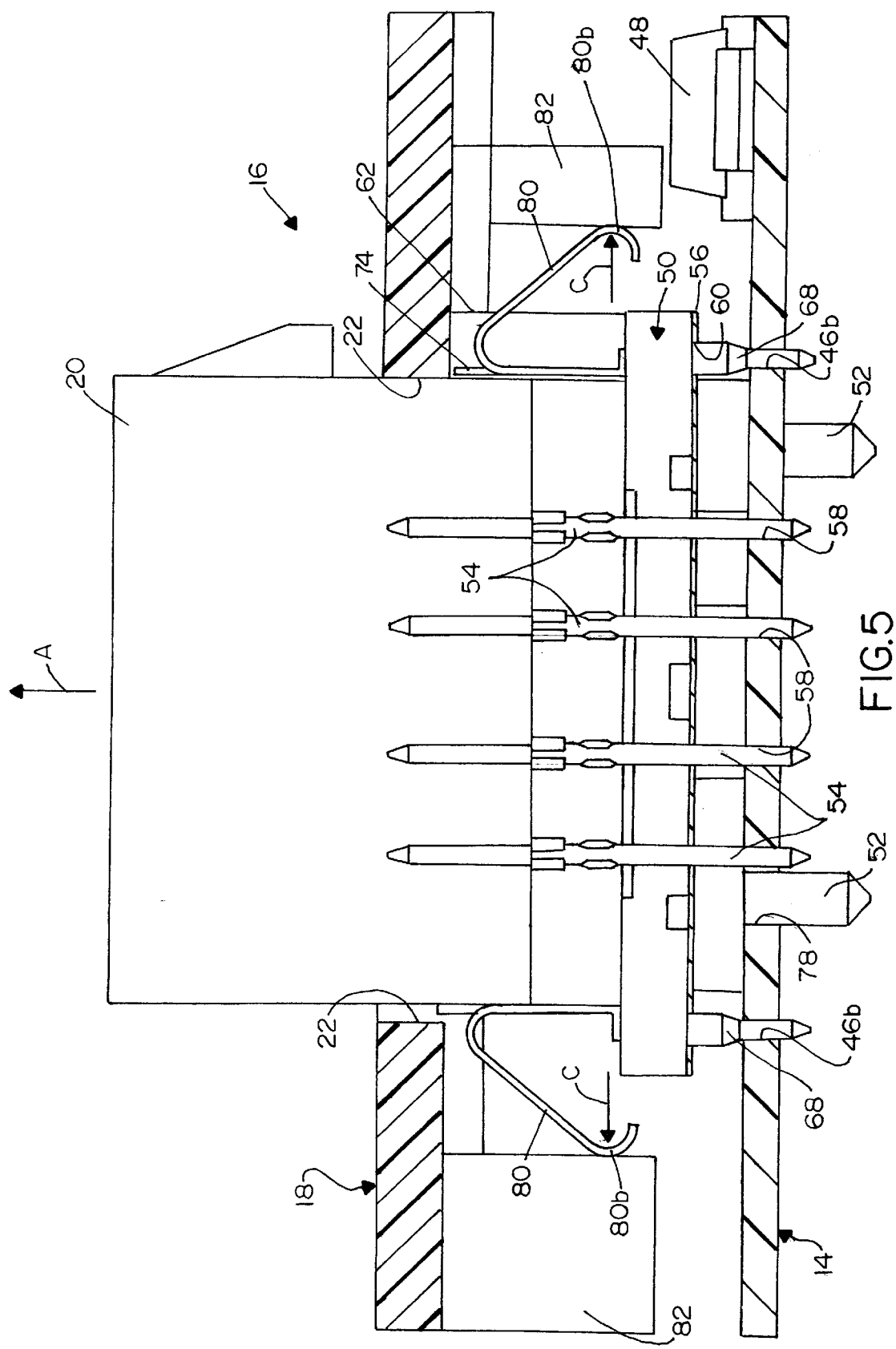
FIG. 5 is a view similar to that of FIG. 3, but of an alternative embodiment of the invention.
Figure 6:
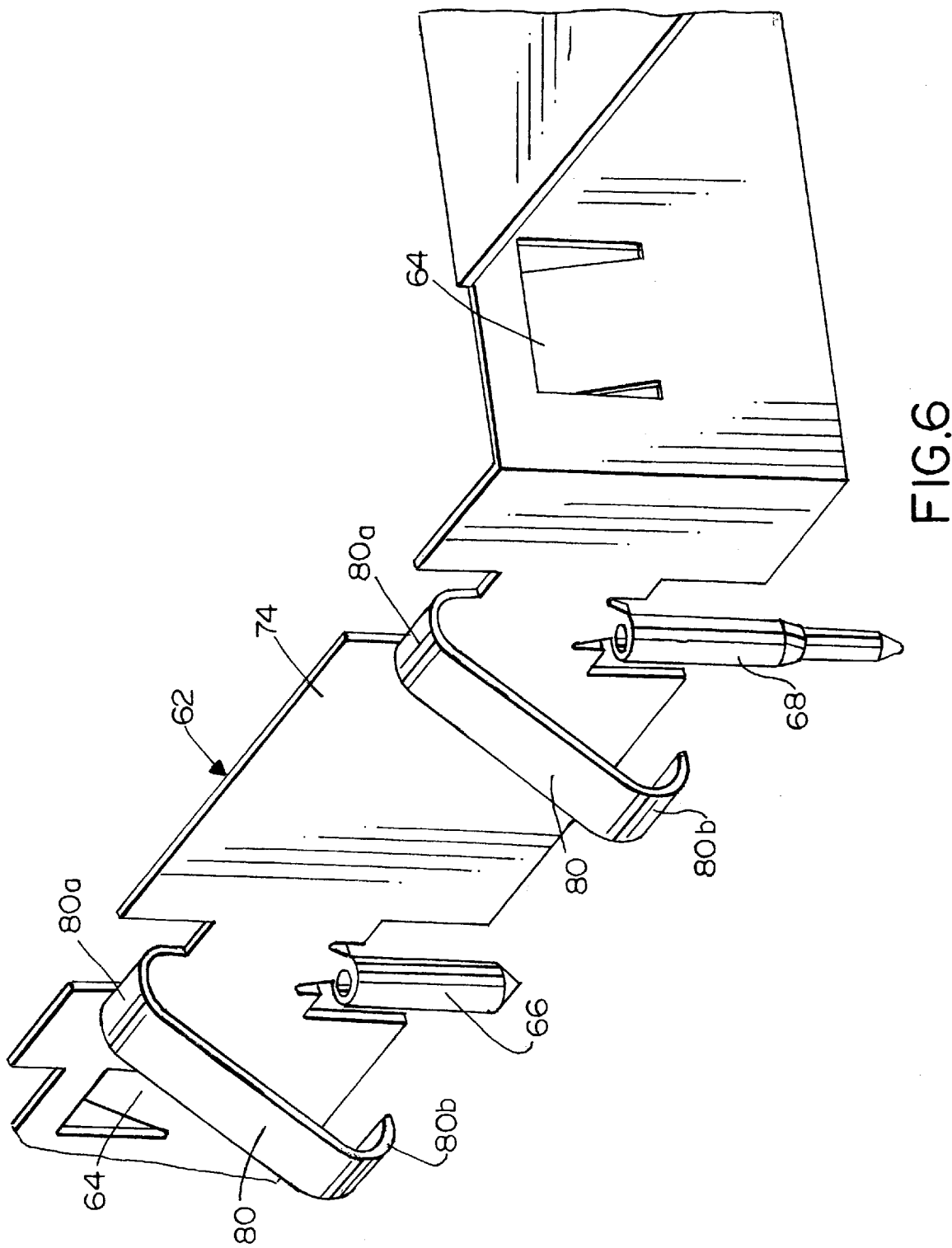
FIG. 6 is a fragmented perspective view of one corner of the shield in the embodiment of FIG. 5.

FIGS. 5 and 6 show an alternative embodiment of the invention wherein a plurality of differently configured contact beams 80 project outwardly from side walls 74 of shield 62 for engaging internal walls 82 of chassis 18 in normal directions "C" (FIG. 5) which are generally perpendicular to the insertion direction "A" as described above. These contact beams can be employed in applications wherein it is not desirable to have any loads acting on the connector assembly in the insertion direction thereof.

In particular, contact beams 80 of the stamped and formed sheet metal shield 42 are bent outwardly of side walls 74, as at 80a (FIG. 6) and then folded back over the respective side wall of the shield and, therefore, the side walls of the connector housing. Each contact beam is then bent back inwardly, as at 80b, to provide a rounded distal end for applying strong engagement forces against side walls 82 of chassis 18 in normal directions "C" perpendicular to insertion direction "A".

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A shielded electrical connector system, comprising:
a conductive chassis having an opening; and
an electrical connector insertable into the opening in the chassis in an insertion direction, the connector including
a dielectric housing mounting a plurality of terminals, and
a conductive shield mounted substantially about the connector housing to protect the connector against electromagnetic interference and including at least one side wall having a contact beam projecting outwardly therefrom and extending back over the side wall to apply a normal force to the chassis adjacent said opening in a direction generally perpendicular to said insertion direction.

2. The shielded electrical connector system of claim 1 wherein said conductive shield is stamped and formed of sheet metal material, and said contact beam is bent outwardly of and folded back over the side wall of the shield.

3. The shielded electrical connector system of claim 2 wherein said contact beam terminates in a rounded distal end for engaging the chassis adjacent said opening.

4. The shielded electrical connector system of claim 1 wherein said conductive shield substantially surrounds the dielectric housing, and including a plurality of said contact beams spaced along at least two opposite sides of the connector.

5. The shielded electrical connector system of claim 1 wherein said conductive chassis is fabricated of die-cast metal material.

6. A shielded electrical connector, comprising:

a dielectric housing insertable into an opening a chassis in an insertion direction;

a plurality of terminals mounted on the housing; and a conductive shield mounted substantially about the connector housing to protect the connector against electromagnetic interference and including at least one side wall having a contact beam projecting outwardly therefrom and extending back over the side wall to apply a normal force to the chassis adjacent said opening in a direction generally perpendicular to said insertion direction.

7. The shielded electrical connector of claim 6 wherein said conductive shield is stamped and formed of sheet metal material, and said contact beam is bent outwardly of and folded back over the side wall of the shield.

8. The shielded electrical connector of claim 7 wherein said contact beam terminates in a rounded distal end for engaging the chassis adjacent said opening.

9. The shielded electrical connector of claim 6 wherein said conductive shield substantially surrounds the dielectric housing, and including a plurality of said contact beams spaced along at least two opposite sides of the connector.

10. A shielded electrical connector system, comprising:

a conductive chassis having an opening; and an electrical connector insertable into the opening in the chassis in an insertion direction, the connector including a dielectric housing mounting a plurality of terminals, and a conductive shield mounted substantially about the connector housing to protect the connector against electromagnetic interference and including at least one side wall having a contact beam projecting outwardly therefrom and formed to apply a normal force to a surface of the chassis adjacent said opening in a direction generally perpendicular to said insertion direction.

11. The shielded electrical connector system of claim 10 wherein said conductive shield is stamped and formed of sheet metal material.

12. The shielded electrical connector system of claim 11 wherein said conductive chassis is fabricated of die-cast metal material.

13. The shielded electrical connector system of claim 10 wherein said conductive shield substantially surrounds the dielectric housing, and including a plurality of said contact beams spaced along at least two opposite sides of the connector.

14. A shielded electrical connector, comprising:

a dielectric housing insertable into an opening a chassis in an insertion direction;

a plurality of pin terminals mounted on the housing; and a conductive shield mounted substantially about the housing to protect the connector against electromagnetic interference and including at least one side wall having a contact beam projecting outwardly therefrom and formed to apply a normal force to the chassis adjacent said opening in a direction generally perpendicular to said insertion direction.

15. The shielded electrical connector of claim 14 wherein said conductive shield is stamped and formed of sheet metal material.

16. The shielded electrical connector of claim 15 wherein said conductive chassis is fabricated of die-cast metal material.

17. The shielded electrical connector of claim 14 wherein said conductive shield substantially surrounds the dielectric housing, and including a plurality of said contact beams spaced along at least two opposite sides of the connector.

* * * * *